(12) United States Patent
Hashimoto et al.

(10) Patent No.: US 8,404,571 B2
(45) Date of Patent: Mar. 26, 2013

(54) FILM DEPOSITION METHOD

(75) Inventors: Shin Hashimoto, Itami (JP); Tatsuya Tanabe, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/000,835

(22) PCT Filed: Jun. 25, 2009

(86) PCT No.: PCT/JP2009/061633
§ 371 (c)(1),
(2), (4) Date: Dec. 22, 2010

(87) PCT Pub. No.: WO2009/157514
PCT Pub. Date: Dec. 30, 2009

(65) Prior Publication Data
US 2011/0097880 A1    Apr. 28, 2011

(30) Foreign Application Priority Data
Jun. 27, 2008 (JP) .................. 2008-168597

(51) Int. Cl.
H01L 21/02 (2006.01)
C23C 16/30 (2006.01)
C30B 25/02 (2006.01)
C30B 29/40 (2006.01)

(52) U.S. Cl. .......... 438/492; 438/503; 438/507; 117/90; 117/94; 117/106

(58) Field of Classification Search .................. 438/478, 438/8, 455, 457, 458, 459, 487; 257/76, 257/E21.53, E29.089, E21.09, E21.122; 117/4, 117/7, 10
See application file for complete search history.

(56) References Cited

U.S. PATENT DOCUMENTS
3,808,674 A * 5/1974 Francombe et al. ............ 117/94
(Continued)

FOREIGN PATENT DOCUMENTS
| JP | 05-251427 A | 9/1993 |
| JP | 06112120 | * 4/1994 |
| JP | 2003-197535 A | 7/2003 |
| JP | 2004-349402 A | 12/2004 |
| JP | 2007-214344 A | 8/2007 |
| JP | 2007-273814 A | 10/2007 |

OTHER PUBLICATIONS

Akasaki et al., "12.3.3 Heteroepitaxial Multilayered Structure," Advanced Electronics Series I-21, Group III Nitride Semiconductor, Chapter 12, Baifukan Co., Ltd., pp. 230-235 (1999).
Akasaki et al, "8. Metalorganic Vapor Phase Epitaxy (MOVPE)," Advanced Electrics Series I-21, Group III Nitride Semiconductor, chapter 8, Baifukan Co., Ltd., pp. 147-165 (1999).

*Primary Examiner* — Olik Chaudhuri
*Assistant Examiner* — Wilner Jean Baptiste
(74) *Attorney, Agent, or Firm* — Venable LLP; Michael A. Sartori; Tamatane J. Aga

(57) ABSTRACT

Provided is a film deposition method capable of improving the crystal characteristic near an interface according to the lattice constant of a material that will constitute a thin film to be deposited. Specifically, a substrate is curved relative to the direction along one main surface on which the thin film is to be deposited, according to the lattice constant the material that will constitute the thin film to be deposited and the lattice constant of a material constituting the one main surface. The thin film is deposited on the one main surface of the substrate with the substrate curved.

12 Claims, 6 Drawing Sheets

U.S. PATENT DOCUMENTS

| | | | |
|---|---|---|---|
| 4,830,984 A | 5/1989 | Purdes | |
| 5,042,059 A * | 8/1991 | Watanabe et al. | 378/145 |
| 5,044,943 A * | 9/1991 | Bowman et al. | 432/121 |
| 5,776,246 A * | 7/1998 | Tanabe et al. | 117/89 |
| 7,262,112 B2 * | 8/2007 | Xie | 438/457 |
| 2003/0033974 A1 | 2/2003 | Ueda | |
| 2007/0128830 A1 * | 6/2007 | Xie | 438/458 |
| 2009/0321885 A1 * | 12/2009 | Archer et al. | 257/618 |
| 2010/0048002 A1 * | 2/2010 | Kim et al. | 438/503 |

* cited by examiner (A)

(B)

(C)

FILM DEPOSITION METHOD

TECHNICAL FIELD

The present invention relates to a film deposition method of depositing a thin film on one main surface of a substrate, and more particularly to a film deposition method of depositing a thin film with a substrate curved in accordance with the lattice constant of a material that will constitute a thin film to be deposited.

BACKGROUND ART

A typically adopted method when growing a thin film on, for example, one main surface of a semiconductor substrate for forming a semiconductor element is to expose the one main surface of the substrate to source gases that will constitute a thin film to be deposited while heating the substrate. The source gases include, for example, a metalorganic compound of group III nitride semiconductor to be a cation and a group V element to be an anion. By supplying these source gases onto the main surface of the semiconductor substrate having been heated, a thin film is grown on the one main surface of the semiconductor substrate.

The method of growing a thin film as described above is called chemical vapor deposition. The chemical vapor deposition is a kind of epitaxial crystal growth. When growing (depositing) a thin film, a thin film of a material different from that constituting the substrate may be grown by chemical vapor deposition on the substrate, for example. Such a technique for growing by chemical vapor deposition a thin film of a material different from that constituting the substrate is called heteroepitaxial growth. A film deposited (grown) is called a heteroepitaxial film, and an interface between the substrate and the deposited film is called a heterointerface. As will be described later, the substrate as used herein refers to a member on which a film is to be deposited, and includes both a single-layer substrate, on one main surface of which a thin film is to be deposited, and a substrate, on one main surface of which one or more layers of thin films are already deposited, with another thin film to be deposited on one main surface of the thin films (a so-called substrate with an epitaxial film; herein defined as an epi-wafer).

In the case of depositing a heteroepitaxial film as described above, a gallium indium nitride (InGaN) thin film heteroepitaxially grown on gallium nitride (GaN) crystals as shown in, for example, *Group III Nitride Semiconductor*, Chapter 12 (Non-Patent Document 1) is regarded as crystals that are disadvantageously less likely to achieve a sharp change in composition at the interface between InGaN and GaN. More specifically, an InGaN thin film of an intended composition is not formed on GaN crystals, but when forming an InGaN layer of about 5 nm in thickness, for example, a transition layer with a particularly low indium (In) composition is present and extends for about 1 to 2 nm in a direction across the thickness from the interface between InGaN and GaN, which is held to result in reduced sharpness of compositional change at the interface. A similar transition layer may also occur in the case of another material, for example, a gallium aluminum nitride (AlGaN) thin film heteroepitaxially grown on GaN crystals.

The above-described transition layer formed near the interface during heteroepitaxial growth having a nonuniform composition or having a lower composition may degrade characteristics of a semiconductor element that will be manufactured using the heteroepitaxial film. Therefore, performing heteroepitaxial growth such that a thin film sharply changes in composition at the interface while preventing a transition layer from occurring is important to improve the characteristics of a semiconductor element that will be manufactured using the heteroepitaxial film.

For example, *Group III Nitride Semiconductor*, Chapter 8 (Non-Patent Document 2) discloses a method of, when forming a multilayered structure of heteroepitaxial films, conducting a gas change valve having no dead space for instantaneously changing the supply of source gases so that a gas supply amount to a reaction tube and a gas supply amount to a vent are made substantially identical, in order to cause a sharp change in film composition at the interface.

PRIOR ART DOCUMENTS

Patent Documents

Non-Patent Document 1: *Group III Nitride Semiconductor*, Chapter 12, edited and written by Isamu Akasaki, BAIFU-KAN CO., LTD, 1999, p. 230-235

Non-Patent Document 2: *Group III Nitride Semiconductor*, Chapter 8, edited and written Isamu Akasaki, BAIFUKAN CO., LTD, 1999, p. 147-165

SUMMARY OF THE INVENTION

Problems to be Solved by the Invention

For example, growing, on a GaN substrate or thin film, an InGaN heteroepitaxial film having a different lattice constant is difficult merely by adopting the method of instantaneously changing the supply of source gases disclosed in Non-Patent Document 2. An InGaN thin film is grown by supplying vapor-phase trimethylindium (TMIn), trimethylgallium (TMG) and an ammonia gas as source gases. Even with such gases supplied, GaN of the same type having the same lattice constant is likely to be grown on GaN. Therefore, when growing InGaN, In is difficult to be captured particularly at the beginning, and it requires time until the composition is stabilized. As a result, a transition layer where the composition does not change sharply disadvantageously occurs at the interface between GaN and InGaN.

The present invention was made to solve the above-described problems, and an object of the present invention is to provide a film deposition method capable of improving the crystal characteristic near the interface in accordance with the lattice constant of a material that will constitute a thin film to be deposited.

Means for Solving the Problems

A film deposition method according to the present invention is a film deposition method of depositing a thin film on one main surface of a substrate. This film deposition method includes the steps of preparing the substrate, curving the substrate relative to a direction along the one main surface, and depositing the thin film on the one main surface of the substrate with the substrate curved. In addition, after execution of the step of depositing the thin film on the one main surface of the substrate as described above, the film deposition method further includes the steps of curving the substrate in an opposite direction to the direction that the substrate has been curved in the above-described step of curving the substrate relative to the direction along the one main surface, and depositing the thin film on the one main surface of the substrate with the substrate curved in the opposite direction.

The step of curving the substrate as used herein refers to, when a thin film is deposited, intentionally curving the substrate relative to the direction along the main surface. This causes a sharp change in composition at the interface between the substrate and the thin film, which can improve the crystal characteristic near the interface.

Specifically, the step of intentionally curving the substrate relative to the direction along the one main surface when a thin film is formed includes the step of curving the substrate relative to the direction along the main surface in accordance with a first lattice constant as the lattice constant of a material that will constitute the thin film to be deposited and a second lattice constant as the lattice constant of a material constituting the one main surface of the substrate on which the thin film is to be deposited.

The above-described film deposition method is more specifically described. In the step of curving the substrate, when the first lattice constant is larger than the second lattice constant, the substrate is curved in a direction projecting toward the one main surface with respect to the shape before execution of the step of curving the substrate. Similarly, when the first lattice constant is smaller than the second lattice constant, the substrate is curved in a direction recessed toward the one main surface with respect to the shape before execution of the step of curving the substrate.

As described above, the lattice constant (first lattice constant) of a material that will constitute a thin film to be deposited and the lattice constant (second lattice constant) of a material constituting a main surface of a substrate (including an epi-wafer) on which the thin film is to be deposited are compared to determine in either direction the substrate should be curved. Besides, when the first lattice constant is larger than the second lattice constant, for example, the substrate is curved to be closer to a curved shape in the projecting direction toward the one main surface than before execution of the step of curving the substrate. A direction projecting toward the one main surface as used herein refers to a direction in which the one main surface on which the thin film is to be deposited is curved to be closer to a projecting shape as viewed from outside the substrate. Similarly, a direction recessed toward the one main surface refers to a direction in which the one main surface on which the thin film is to be deposited is curved to be closer to a recessed shape as viewed from outside the substrate. Therefore, the case of curving the substrate in the direction projecting toward the one main surface when the one main surface is curved in a deeply recessed shape as viewed from outside the substrate before execution of the step of curving the substrate, for example, includes a case of curving in such a direction that the curvature of the recessed shape decreases (i.e., closer to the curve of a projecting shape), as shown in FIG. 1 at (B), for example.

However, in the step of curving the substrate, when the first lattice constant is larger than the second lattice constant, the substrate is more preferably curved into a projecting shape toward the one main surface. More specifically, this means that, as a result of curving, the main surface on which the thin film is to be deposited is curved into a projecting shape as viewed from outside the substrate, as shown in FIG. 1 at (C). Similarly, when the first lattice constant is smaller than the second lattice constant, the substrate is more preferably curved into a recessed shape toward the one main surface. More specifically, this means that, as a result of curving, the main surface on which the thin film is to be deposited is curved into a recessed shape as viewed from outside the substrate.

FIG. 1 shows, at (A), a schematic sectional view showing the shape of a substrate before execution of the step of curving the substrate. FIG. 1 shows, at (B), a schematic sectional view showing an exemplary state where the substrate shown in FIG. 1 at (A) is curved into a direction projecting toward one main surface. FIG. 1 shows, at (C), a schematic sectional view showing an exemplary state where the substrate shown in FIG. 1 at (A) is curved into a projecting shape toward the one main surface. A substrate 10 shown in FIG. 1 at (A) shall be curved into a recessed shape toward the one main surface. One main surface as used herein shall be positioned at the upper side of the sheet of drawing, as shown in FIG. 1 at (A). For example, when the first lattice constant is larger than the second lattice constant, the substrate is curved to be closer to a curved shape in the projecting direction toward the one main surface than in the state shown in FIG. 1 at (A). As a result, the substrate may be curved such that the curve of a recessed shape decreases, as shown in FIG. 1 at (B). Curving the substrate into a projecting shape toward the one main surface when the above-described first lattice constant is larger than the second lattice constant, for example, refers to curving such that the one main surface on which the thin film is to be deposited has a projecting shape as viewed from outside the substrate, as shown in FIG. 1 at (C).

Curving the substrate as described above increases or decreases the lattice constant indicative of the space between cells by curving when a material having a different lattice constant from the substrate is deposited (by heteroepitaxial growth), so that the second lattice constant becomes substantially closer to the first lattice constant. This enables a sharp change in composition of the thin film at the interface. As a result, the crystal characteristic and the film quality near the interface can be improved.

As the method of curving the substrate herein, it is preferable to adopt a method of curving the substrate by independently controlling heating temperatures of a first heating member disposed to face the one main surface of the substrate and a second heating member disposed to face the other main surface of the substrate opposite to the one main surface. More specifically, when the first lattice constant is larger than the second lattice constant, for example, the first and second heating members are controlled in temperature such that first heating member has a temperature higher than that of the second heating member. Similarly, when the first lattice constant is smaller than the second lattice constant, the first and second heating members are controlled in temperature such that first heating member has a temperature lower than that of the second heating member. As will be described later, the direction that the substrate is warped changes depending on the direction that the substrate is heated. The substrate is preferably curved utilizing this nature.

In the film deposition method according to the present invention, in the step of preparing the substrate, a substrate with a plurality of layers made of materials having different thermal expansion coefficients from each other stacked may be prepared. The degree of curve can then be increased as compared to a typical single-layer substrate. Therefore, in the case of depositing a material having a different lattice constant from the substrate (by heteroepitaxial growth), the composition can be sharply changed at the interface. As a result, the crystal characteristic and the film quality near the interface can be improved.

In the step of depositing the thin film, a source gas of components that will constitute the thin film to be deposited is supplied onto the one main surface of the substrate having been heated. The source gas supplied onto the main surface of the substrate is then subjected to pyrolysis, so that crystals (a thin film) can be formed (deposited) on the main surface of the substrate. The source gas may include metalorganic compound vapors. More preferably, the source gas includes group III element compound vapors.

Effects of the Invention

According to the film deposition method of the present invention, in the case of depositing a thin film made of a material having a lattice constant different from that of a material constituting a substrate, the thin film can be sharply changed in composition at the interface. As a result, the crystal characteristic and the film quality near the interface can be improved, so that a semiconductor element that will be manufactured using the film can be improved in characteristic.

MODES FOR CARRYING OUT THE INVENTION

Embodiments

Figure 1:
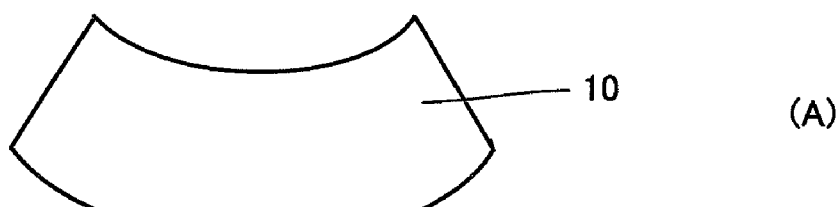
FIG. 1 shows: at (A), a schematic sectional view showing the shape of a substrate before execution of a step of curving the substrate; at (B), a schematic sectional view showing an exemplary state where the substrate shown at (A) is curved in a direction projecting toward one main surface; and at (C), a schematic sectional view showing an exemplary state where the substrate shown at (A) is curved into a projecting shape toward the one main surface.
Figure 1:
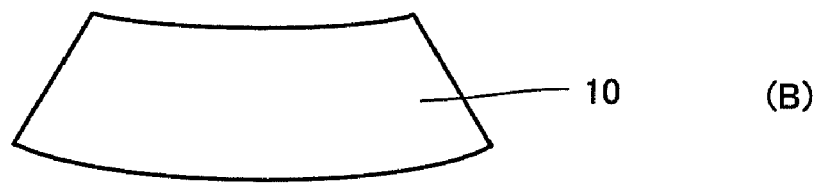
Figure 1:
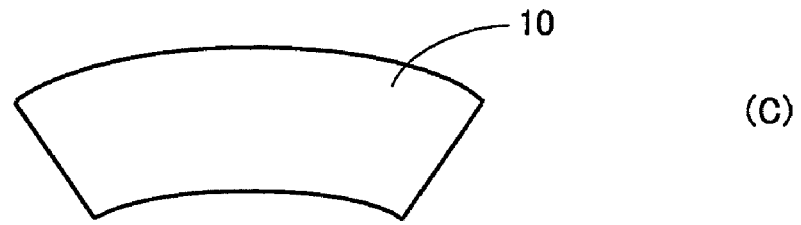
Figure 2:
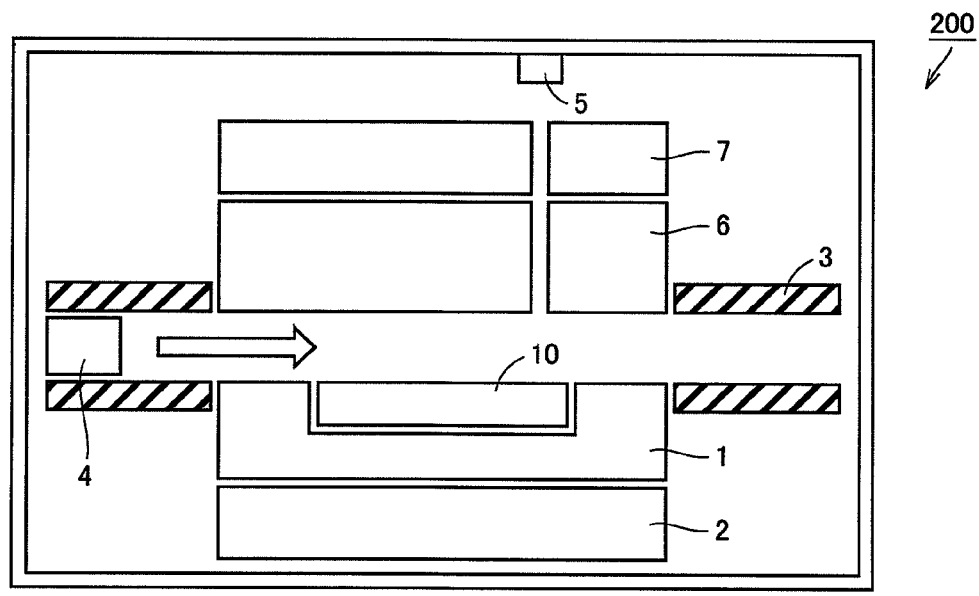
FIG. 2 is a schematic sectional view generally showing the inside of a film deposition apparatus utilizing chemical vapor deposition in an embodiment of the present invention.

First, the principles of a film deposition method of the present invention will be described. As shown in FIG. 2, a film deposition apparatus 200 utilizing chemical vapor deposition according to an embodiment of the present invention includes a heater 7 as a first heating member disposed above a susceptor 1 on which a substrate 10 is to be laid so as to face the upper main surface of susceptor 1 with a heating jig 6 interposed therebetween. A heater 2 as a second heating member is also disposed below susceptor 1, as shown in FIG. 2. A main surface as used herein refers to one of surfaces of substrate 10, susceptor 1 or the like that has the largest area and is laid down in a direction along the horizontal direction. Facing as used herein includes a case in which another member is interposed between two members, such as heater 7 disposed above susceptor 1 with heating jig 6 interposed therebetween.

In each of the methods of heating a semiconductor substrate for heteroepitaxial growth as disclosed in Non-Patent Document 2, a semiconductor substrate to be heated is laid on a susceptor. The susceptor is then heated by methods such as RF heating, resistive heating, infrared lamp heating, or the like. Since the susceptor disclosed in Non-Patent Document 2 serves as a heater for heating, the semiconductor substrate is heated from below. When heated only from one side relative to the direction along the main surfaces in this manner, the semiconductor substrate is warped and curved due to a temperature difference between the upper and lower sides thereof relative to the direction along the main surfaces.

Figure 3:
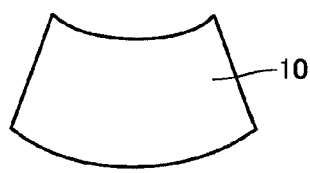
FIG. 3 schematically shows warpage of a substrate when heated from below with a heater disposed below the substrate.
Figure 3:
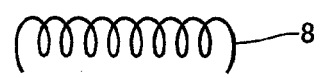
Figure 4:
FIG. 4 schematically shows warpage of a substrate when heated from above with a heater disposed above the substrate.
Figure 4:
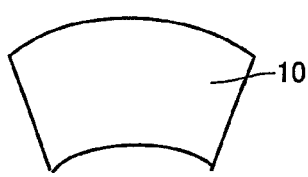

When substrate 10 is heated from below with a heater 8 disposed below substrate 10, the lower main surface of substrate 10 facing heater 8 is heated more than the upper main surface not facing heater 8 to exhibit extensibility. As a result, as shown in FIG. 3, the lower main surface extends, and a compression stress is accordingly applied to the upper main surface. Conversely, a tensile stress is applied to the lower main surface relative to the upper main surface, so that substrate 10 is warped into a downwardly projecting shape. In contrast, when substrate 10 is heated from above, the upper main surface extends, and a compression stress is accordingly applied to the lower main surface, so that substrate 10 is warped into an upwardly projecting shape, as shown in FIG. 4.

Therefore, when a semiconductor substrate is laid on and heated with the susceptor as disclosed in Non-Patent Document 2, for example, the semiconductor substrate is heated from below relative to the direction along the main surfaces. The semiconductor substrate is thus warped into a downwardly projecting shape. In this manner, warpage of a semiconductor substrate relative to the direction along the main surfaces essentially occurs as a result of growth conditions under which certain heteroepitaxial growth is performed, the growth conditions including, for example, the amount, pressure, temperature (electric power applied to the apparatus) of source gases, and so on.

As described above with reference to FIGS. 3 and 4, when a substrate is heated, the direction and amount of warpage of the substrate vary depending on the direction of heating. This means that controlling the direction of heating can thus control the direction and amount of warpage of the substrate. For this reason, heater 7 facing one (upper) main surface of substrate 10 laid on susceptor 1 and heater 2 facing the other (lower) main surface of substrate 10 opposite to heater 7 relative to the main surface of substrate 10 are provided as in aforementioned film deposition apparatus 200 shown in FIG. 2, for example. Substrate 10 can then be heated from either the upper side or the lower side main surface of substrate 10. Therefore, the direction and amount of warpage of substrate 10 can be controlled by controlling the outputs (heating temperatures) of heaters 7 and 2.

When an indium gallium arsenide (InGaAs) thin film is deposited by heteroepitaxial growth on one main surface of a gallium arsenide (GaAs) substrate, for example, the substrate is warped into a projecting shape toward the deposited InGaAs thin film relative to the direction along the main surfaces.

Figure 5:
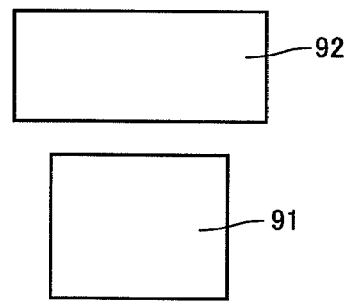
FIG. 5 schematically shows cells for presenting an image of a state of depositing a thin film of a material having a lattice constant larger than that of a material constituting a substrate, on one main surface of the substrate.
Figure 6:
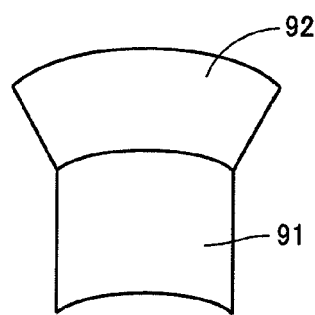
FIG. 6 is a schematic diagram for presenting an image of a state where the respective materials shown in FIG. 5 are joined to each other.

As shown in FIG. 5, a larger cell 92 (wider in the lateral direction in the drawing) is joined onto one main surface of a smaller cell 91 (narrower in the lateral direction in the drawing) having a smaller lattice constant, that is, onto a crystal axis which is the upper side of smaller cell 91 in FIG. 5, larger cell 92 having a lattice constant larger than that of smaller cell 91. Larger cell 92 having a larger lattice constant then starts to join such that the crystal axis has the same length as that of smaller cell 91 having a smaller lattice constant. As a result, as shown in FIG. 6, larger cell 92 and smaller cell 91 are warped and curved into a projecting shape toward larger cell 92. Therefore, when an InGaAs thin film having a lattice constant larger than that of GaAs is deposited on a GaAs substrate, the substrate is curved into a projecting shape toward the InGaAs thin film.

For this reason, in the case of depositing an InGaAs thin film on a GaAs substrate, for example, InGaAs deposition is preferably performed by heating a heater disposed to face one main surface of the GaAs substrate on which InGaAs is to be deposited to bring in advance the GaAs substrate into a projecting shape, that is, with the GaAs substrate warped toward the surface on which InGaAs is to be deposited relative to the direction along the main surfaces. This is because the lattice constant of the outermost surface of GaAs on which InGaAs is to be deposited at the side where InGaAs is to be deposited is increased because of apparent warpage in the projecting direction, so that the difference in lattice constant from InGaAs substantially decreases. This allows InGaAs to be deposited sharply on GaAs as easily as possible. As described, InGaAs can be deposited in advance sharply on GaAs by heating, which can improve the characteristic at the interface.

Figure 7:
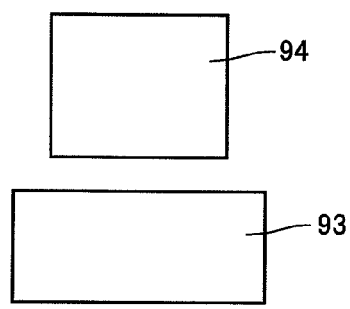
FIG. 7 schematically shows cells for presenting an image of a state of depositing a thin film of a material having a lattice constant smaller than that of a material constituting a substrate, on one main surface of the substrate.
Figure 8:
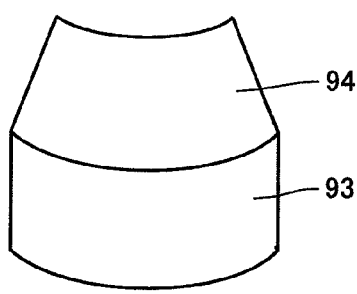
FIG. 8 is a schematic diagram for presenting an image of a state where the respective materials shown in FIG. 7 are joined to each other.

As shown in FIG. 7, a smaller cell 94 is joined onto one main surface of a larger cell 93 having a larger lattice constant, that is, onto a crystal axis which is the upper side of larger cell 93 in FIG. 7, smaller cell 94 having a lattice constant smaller than that of larger cell 93. Smaller cell 94 having a smaller lattice constant then starts to join such that the crystal axis has the same length as that of larger cell 93 having a larger lattice constant. As a result, as shown in FIG. 8, smaller cell 94 and larger cell 93 are warped and curved into a recessed shape toward smaller cell 94.

As described above, when a heteroepitaxial film is deposited, the thin film at the interface can be changed in composition more sharply by controlling the direction of heating the substrate to thereby control the direction of warpage of the substrate on which the thin film is to be deposited, besides controlling the flow of source gases and the change of their supply. As a result, the crystal characteristic and the film quality near the interface can be improved. A semiconductor element that will be manufactured with the heteroepitaxial film, for example, can thus be improved in electric characteristics such as channel mobility.

Figure 9:
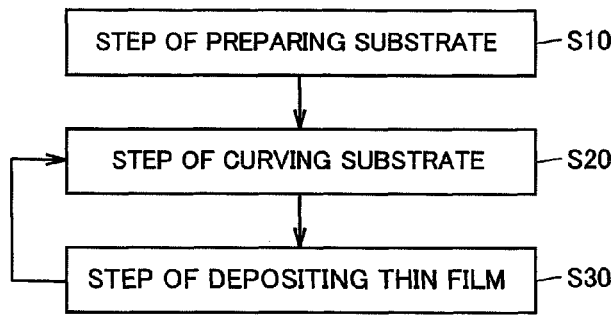
FIG. 9 is a flow chart showing a procedure of a film deposition method of the present invention.

The film deposition method according to the present invention will now be described in detail. As shown in FIG. 9, a step (S10) of preparing a substrate is first executed. More specifically, the step is to prepare a substrate on which a film is desired to be deposited (on which a film is to be deposited) by heteroepitaxial growth.

The substrate as used herein refers to a member on which a film is to be deposited, and includes both a single-layer substrate, on one main surface of which a thin film is to be deposited, and a substrate, on one main surface of which one or more layers of thin films are already deposited, with another thin film to be deposited on one main surface of the thin films (a so-called substrate with an epitaxial film; herein defined as an epi-wafer). The substrate as used herein can further include a substrate, for example, on one main surface of which one or more layers of thin films made of materials having thermal expansion coefficients different from that of a material constituting the substrate are stacked (by a method different from epitaxial growth).

The above-mentioned single-layer substrate includes, for example, a sapphire substrate, a silicon substrate, and so forth. Alternatively, a wafer (substrate) of a compound semiconductor such as GaN, silicon carbide (SiC), aluminum nitride (MN) or aluminum gallium nitride (AlGaN) may be used. The substrate (epi-wafer), on one main surface of which one or more layers of thin films are already deposited, includes, for example, a sapphire substrate (a so-called GaN template), on one main surface of which a GaN thin film is deposited.

A step (S20) of curving the substrate is then executed. More specifically, substrate 10 on which a film is to be deposited is first laid on top of susceptor 1 of aforementioned film deposition apparatus 200. Outputs (heating temperatures) of heaters 7 and 2 of film deposition apparatus 200 are then controlled so that substrate 10 is curved in a desired direction relative to the direction along the main surfaces. The step of curving the substrate as used herein refers to intentionally curving the substrate relative to the direction along the main surfaces when a thin film is deposited.

Laser light emitted from a module 5 disposed at an inner ceiling section (upper side) in film deposition apparatus 200 can be used to measure the curvature or warpage of substrate 10 which will be described later, that is, the degree of curve relative to the direction along the main surfaces of substrate 10.

It is to be noted that heating jig 6, heater 7 and flow channel 3 are shown as being partially discontinuous in the lateral direction in FIG. 2 for easily presenting an image of transmission of laser light emitted from module 5 onto the main surface of substrate 10. Any member implemented by heating jig 6 and heater 7 extending continuously in the lateral direction may be used as long as it can transmit laser light. FIG. 2 is a sectional view, and heating jig 6, heater 7 and flow channel 3 actually constitute a single member. It is to be noted that although laser light from module 5 is emitted from above in FIG. 2, laser light can also be emitted slantwise from a side of flow channel 3. In this case, heating jig 6 and heater 7 do not need to be machined to be discontinuous in the lateral direction as shown in FIG. 2.

As described earlier, susceptor 1 is a member on which substrate 10 is laid. In addition, susceptor 1 and heating jig 6 both serve to conduct heat of the heaters uniformly to substrate 10. More specifically, heating jig 6 transmits heat generated by heater 7 uniformly to substrate 10, and susceptor 1 transmits heat generated by heater 2 uniformly to substrate 10. Susceptor 1 and heating jig 6 are both made of carbon (C) coated with a silicon carbide (SiC) thin film, for example. Silicon carbide, having a high thermal conductivity and a high heat resistance, can transmit heat smoothly to substrate 10. It is to be noted that, in addition to the above-mentioned material, quartz, sapphire, SiC, carbon coated with pyrolytic carbon, boron nitride (BN), or tantalum carbide (TaC), for example, can be used as a material of susceptor 1 and heating jig 6.

The step (S20) is to curve the substrate relative to the direction along the main surfaces in accordance with the lattice constant (first lattice constant) of a material that will constitute a thin film to be deposited and the lattice constant (second lattice constant) of a material constituting one main surface of the substrate on which the thin film is to be deposited. It is to be noted that, as to the material constituting one main surface of the substrate as used herein, the lattice constant of a material constituting the substrate is the second lattice constant when the substrate is a single-layer substrate. However, from the foregoing description, in the case of, for example, a substrate (epi-wafer), on one main surface of which one or more layers of thin films are already deposited, a main surface of the uppermost thin film on which a thin film is to be deposited subsequently is the surface on which a thin film is deposited (main surface of the substrate), and the lattice constant of a material constituting this surface on which the thin film is deposited is the second lattice constant.

The first lattice constant and the second lattice constant are compared to determine in which direction the substrate should be curved. When the first lattice constant is larger than the second lattice constant, the temperatures of heaters 7 and 2 are controlled such that heater 7 as the first heating member disposed to face one main surface of substrate 10 (on which a film is to be deposited; at the upper side in the drawing) is higher in temperature than heater 2 as the second heating member disposed to face the other main surface of substrate 10 (at the lower side in the drawing) opposite to the one main surface. When the first lattice constant is smaller than the second lattice constant, the temperatures of heaters 7 and 2 are controlled such that heater 7 is lower in temperature than heater 2.

More specifically, when the first lattice constant is larger than the second lattice constant, the above-described state of substrate 10 shown in FIG. 4 is preferable. Heating with heater 8 from above, for example, exerts a force that curves substrate 10 in the direction projecting toward the one main surface of substrate 10 (on which a film is to be deposited; at the upper side) on substrate 10, so that the substrate is preferably curved into an upwardly projecting shape with respect to the shape before execution of the step of curving substrate 10. For example, if substrate 10 is curved at a great curvature in the direction recessed upwardly in the initial state before heating of substrate 10, heating with heater 8 from above as shown in FIG. 4 may not bring substrate 10 into an upwardly projecting shape. In this case, substrate 10 is preferably curved at least in the direction projecting upwardly to reduce the curvature of the curve in the recessed direction, to thereby bring about a state closer to a projecting shape than in the initial state. In this case, as shown in FIG. 4, substrate 10 is preferably heated from above, that is, only with heater 7 (see FIG. 2), for example, to be curved in the direction projecting upwardly. Alternatively, heating temperatures of both the heaters may be controlled independently such that heater 7 is higher in heating temperature than heater 2.

Similarly, when the first lattice constant is smaller than the second lattice constant, the above-described state of substrate 10 shown in FIG. 3 is preferable. Heating with heater 8 from below, for example, exerts a force that curves substrate 10 in the direction recessed toward the one main surface of substrate 10 (on which a film is to be deposited; at the upper side) on substrate 10, so that substrate 10 is preferably curved into an upwardly recessed shape with respect to the shape before execution of the step of curving substrate 10. For example, if substrate 10 is curved at a great curvature in the direction projecting upwardly in the initial state before heating of substrate 10, heating with heater 8 from below as shown in FIG. 4 may not bring substrate 10 into an upwardly recessed shape. In this case, substrate 10 is preferably curved at least in the direction recessed upwardly to reduce the curvature of the curve in the projecting direction, to thereby bring about a state closer to a recessed shape than in the initial state. In this case, as shown in FIG. 3, substrate 10 is preferably heated from below, that is, only with heater 2 (see FIG. 2), for example, to be curved in the direction recessed upwardly. Alternatively, heating temperatures of both the heaters may be controlled independently such that heater 7 is lower in heating temperature than heater 2.

Figure 10:
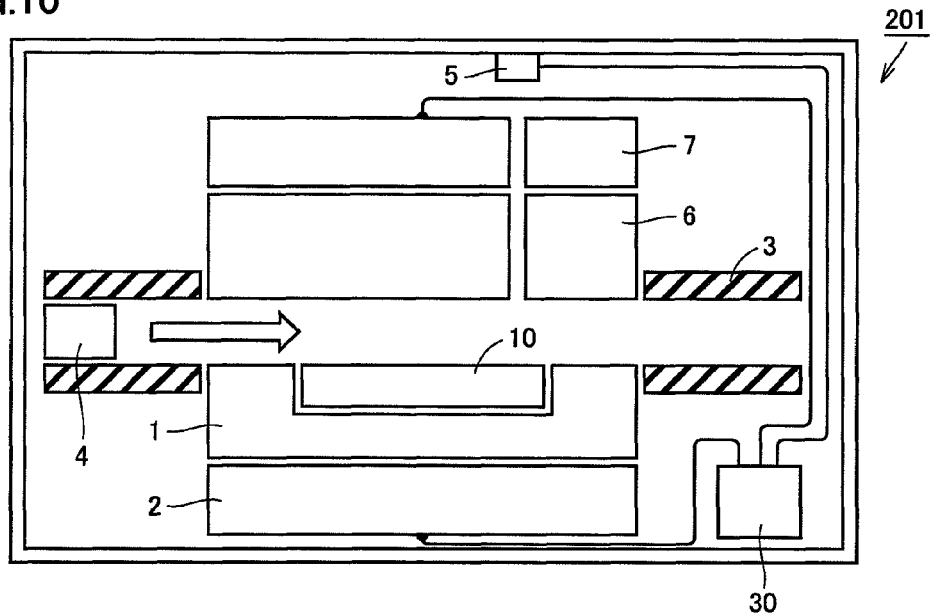
FIG. 10 is a schematic sectional view generally showing the inside of a film deposition apparatus 201 having a controller that controls the temperature of a heater.

A film deposition apparatus 201 shown in FIG. 10 has a structure in which a controller 30 is added to film deposition apparatus 200 shown in FIG. 2, the controller 30 controlling temperatures of heater 7 as the first heating member disposed to face one main surface of substrate 10 and heater 2 as the second heating member disposed to face the other main surface of substrate 10 opposite to the one main surface. Controller 30 is connected to module 5 to be capable of controlling the temperatures of heaters 7 and 2 independently in real time such that the curvature as well as the direction and amount of warpage of substrate 10 are changed to a predetermined direction and value in accordance with the result that module 5 measures the curvature of substrate 10 in the direction along the main surfaces. Controller 30 connected to module 5 is connected to heaters 7 and 2 to control the heating temperatures of heaters 7 and 2 independently in real time, to thereby create a temperature difference between a region facing one main surface of substrate 10 and a region facing the other main surface. This will bring about the state shown in FIG. 3 or 4, for example, and the curvature as well as the direction and amount of warpage of substrate 10 will be controlled. As a result, the curvature as well as the direction and amount of warpage of substrate 10 are changed to a predetermined direction and value.

Module 5 measuring the curvature of substrate 10 indicative of the degree of curve can be implemented by an in-situ monitor, for example. Module 5 (in-situ monitor) for measuring the curvature (warpage) of substrate 10 during film deposition may be implemented by a commercially-available one. Some measure the curvature of substrate 10 at a single point, while others are capable of measuring the shape of warpage of substrate 10. Any of such devices may be used herein. Alternatively, another device may be used. To measure warpage of substrate 10 after film deposition, any of the above-described devices may be used, and a profilometer and a surface roughness tester, for example, may also be used additionally. However, since the step (S20) shown in FIG. 9 and a step (S30) which will be described below in detail or a transition from the step (S20) to the step (S30) is a growth sequence in the film deposition apparatus, a mechanism capable of making measurements within film deposition apparatus 200 (or film deposition apparatus 201) is preferably used when a profilometer and a surface roughness tester are used.

The step (S30) of depositing a thin film is now executed. More specifically, the heating temperatures of the two heaters heating substrate 10 provided in film deposition apparatus 200 (or film deposition apparatus 201) are controlled independently at the step (S20) as described above, so that a heteroepitaxial film made of a material having a lattice constant different from that of one main surface of substrate 10 is deposited on the one main surface of substrate 10 with substrate 10 curved in a desired direction by a desired amount.

In the state where the heating temperatures of the two heaters heating substrate 10 provided in film deposition apparatus 200 are independently controlled to control the curvature as well as the direction and amount of warpage of substrate 10, substrate 10 is heated. While maintaining this state where substrate 10 is heated while being curved, source gases having components that will constitute a thin film to be deposited are supplied onto the one main surface of substrate 10. The source gases supplied onto the one main surface of substrate 10 are then subjected to pyrolysis, so that crystals (a thin film) can be formed on the main surface of substrate 10.

As shown in aforementioned FIG. 2 and FIG. 10, flow channel 3 through which source gases are flown is disposed above susceptor 1 in film deposition apparatus 200 or film deposition apparatus 201. The source gases of components that will constitute a thin film to be deposited are flown through a source gas nozzle 4 disposed at one end (upstream side) of flow channel 3 into flow channel 3 while heaters 7 and 2 are heating susceptor 1 and substrate 10 laid thereon, so that one main surface of substrate 10 (the upper main surface shown in FIG. 2 or 10) is exposed to the source gases. A thin film made of the supplied source gases is then deposited on the main surface of substrate 10 having been heated.

Flow channel 3 is a pipe provided for supplying the source gases onto the main surface of substrate 10. As a material of this flow channel 3, quartz is used, for example. Alternatively, carbon coated with an SiC thin film, sapphire, SiC, carbon coated with pyrolytic carbon, BN, TaC, SUS, or nickel (Ni) can be used. The source gases that will constitute a thin film to be deposited are supplied into flow channel 3 through source gas nozzle 4. At this stage, when substrate 10 is heated with heaters 7 and 2, the source gases supplied onto the main surface of substrate 10 can be subjected to pyrolysis to form crystals (a thin film) on the main surface of substrate 10.

For example, assume that substrate 10 is implemented by a sapphire substrate (c plane) to form a group III semiconductor thin film on one main surface of the sapphire substrate. In this case, the gases supplied onto the main surface of substrate 10 through source gas nozzle 4 are implemented by vapors of a liquid or solid metalorganic compound having a high vapor pressure at normal temperatures obtained by adding a methyl group ($-CH_3$) to metal that will constitute a thin film and a hydride gas of a non-metallic material are used. Adopting metalorganic vapor phase epitaxy (MOVPE) of spraying these gases onto the main surface of substrate 10 having been heated to cause pyrolysis of the gases, to thereby obtain semiconductor crystals, a group III compound semiconductor thin film can be deposited on the main surface of substrate 10. As described above, heating with the heaters are carried out for causing pyrolysis of the supplied gases to deposit crystals as a thin film.

Alternatively, vapor phase epitaxy (VPE) may be adopted in which a chloride gas is used as a gas supplied through source gas nozzle 4 onto the main surface of substrate 10. Particularly, vapor phase epitaxy using a chloride gas and a hydride gas of a non-metallic material are used is called hydride vapor phase epitaxy (H-VPE). These source gases are sprayed onto the main surface of substrate 10 having been heated to cause pyrolysis, to thereby obtain semiconductor crystals. With film deposition apparatus 200, any of the above-mentioned MOVPE, VPE and H-VPE can be adopted.

In any case, when a thin film of a group III element semiconductor compound is to be deposited, for example, vapors of a group III element compound are preferably supplied through source gas nozzle 4.

It is to be noted that, in many cases, not only a single layer but also two or more layers of heteroepitaxial films made of different materials are actually deposited by the above-described film deposition method. Therefore, the step (S20) of curving a substrate in the opposite direction of the direction that the substrate has been curved in the step (S20) of curving the substrate, relative to the direction along the main surfaces, and the step (S30) of depositing a thin film on one main surface of the substrate with the substrate, that is, an epi-wafer curved in the opposite direction may be performed again. For example, consider the case where a material having the above-described first lattice constant (referred to as $\alpha$) larger than the second lattice constant is epitaxially grown as a thin film, and then, on one main surface of the epitaxially-grown thin film, a material having the first lattice constant (referred to as $\beta$) smaller than $\alpha$ (second lattice constant) is epitaxially grown as a thin film. In this case, when the first thin film having the lattice constant $\alpha$ is deposited, film deposition is executed with only heater 7 shown in FIG. 2, for example, heated to bring about the state shown in FIG. 4. When the thin film having the lattice constant $\beta$ is to be deposited thereon, film deposition is executed with only heater 2 shown in FIG. 2, for example, heated to bring about the state shown in FIG. 3 because $\beta<\alpha$. In this manner, the step (S20) of curving the substrate by changing the type of heaters heating substrate 10 and heating temperatures of the heaters and the step (S30) of depositing a thin film are preferably repeated to stack two or more layers of heteroepitaxial films made of different materials.

When a heteroepitaxial film is deposited on substrate 10 with the direction and amount of warpage controlled adopting the above-described film deposition method, the thin film can be changed sharply in composition at the interface between the deposited heteroepitaxial film and the main surface of the substrate on which the film is deposited. As a result, the crystal characteristic and the film quality near the interface can be improved.

First Example

Figure 11:
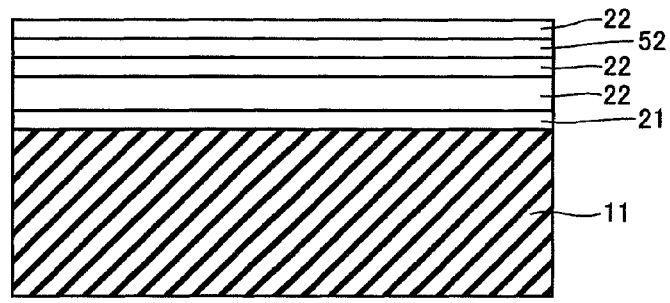
FIG. 11 is a schematic sectional view of a heteroepitaxial structure in a first example of the present invention.

Samples of a stacked structure (heteroepitaxial structure) of heteroepitaxial films, which will be described below, were prepared by heteroepitaxial growth with metalorganic vapor phase epitaxy (MOVPE) adopted. As shown in FIG. 11, low-temperature GaN 21 of 25-nm thickness was deposited on one main surface of a 1-inch-diameter sapphire substrate 11. GaN 22 of 3 μm thickness was deposited thereon. Further, GaN 22 of 10-nm thickness was deposited thereon, and a 3-nm-thick thin film of InGaN 52 having an indium (In) composition of 15%, and then GaN 22 of 10-nm thickness were deposited thereon. A single quantum well having the above-described stacked structure is obtained. That is, the single quantum well obtained herein includes GaN (10 nm)/InGaN (In composition of 15%, 3 nm)/GaN (10 nm)/GaN (3 μm)/low-temperature GaN (25 nm)/sapphire substrate, in this order from the outermost layer to the substrate. Herein, three types of samples of the above-described single quantum well were prepared.

Figure 18:
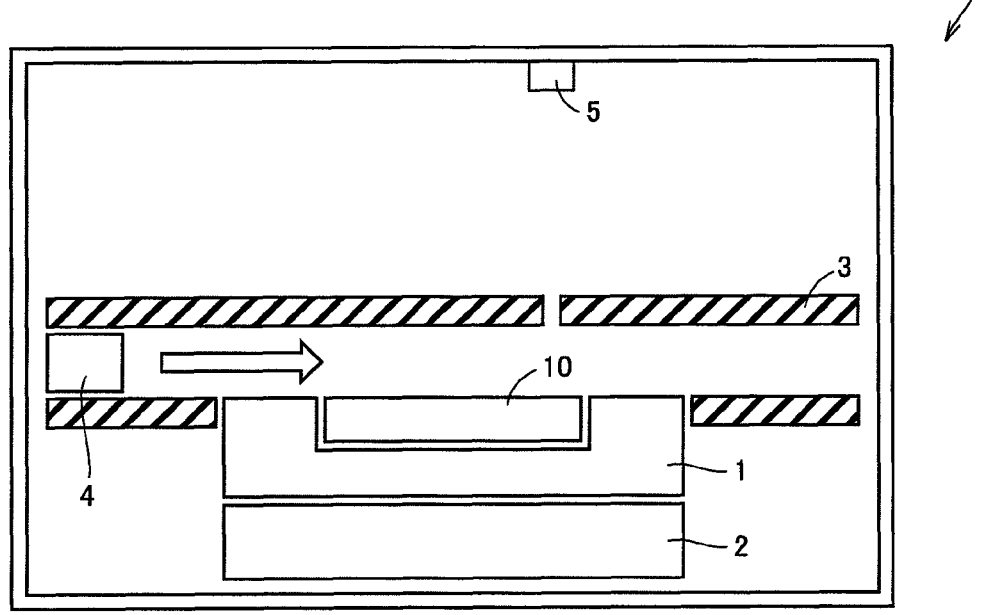
FIG. 18 is a schematic sectional view generally showing the inside of a conventionally-adopted film deposition apparatus utilizing chemical vapor deposition.

As shown in FIG. 18, a conventionally-adopted film deposition apparatus 100 utilizing chemical vapor deposition includes heater 2 as a heating member only at the lower side relative to the direction along main surfaces of susceptor 1 on which substrate 10 is to be laid (at the side facing the other main surface opposite to the side at which substrate 10 is laid in FIG. 18). Film deposition apparatus 100 differs from film deposition apparatus 200 in this respect.

A sample 1-1 was obtained by film deposition using film deposition apparatus 100. More specifically, all the epitaxial films were deposited by heating from below substrate 10 to form the above-described single quantum well. For a sample 1-2, all the epitaxial films were deposited by heating from below substrate 10 (with heater 2) using film deposition apparatus 200 to form the above-described single quantum well. Film deposition apparatus 200 was also used for a sample 1-3 to deposit low-temperature GaN 21 (of 25-nm thickness) on one main surface of sapphire substrate 11 and GaN 22 (of 3-μm thickness) thereon by heating from below substrate 10 with heater 2. A single quantum well thereon including GaN 22 (10 nm), InGaN 52 (3 nm, 15% In) and GaN 22 (10 nm) was deposited by heating from above substrate 10 with heater 7.

Conditions under which the films were deposited to obtain the respective single quantum wells of samples 1-1, 1-2 and 1-3 were such that substrate 10 had a temperature of 750° C. and the pressures by source gases were normal pressures. Although not shown in film deposition apparatus 100 and 200, the curvature of substrate 10 was measured in real time with module 5 while the heating temperatures of the heaters (heaters 7 and 2) were controlled by controller 30 shown in film deposition apparatus 201. The direction and amount of warpage were also measured in real time.

When obtaining samples 1-1 and 1-2, substrate 10 was curved into a recessed shape toward heater 7 during deposition of all the epitaxial films because heating was conducted from below (at the side of heater 2) relative to the direction along the main surfaces of substrate 10. When obtaining sample 1-3, substrate 10 was curved into a recessed shape toward heater 7 at the time point when low-temperature GaN 21 (of 25-nm thickness) on one main surface of sapphire substrate 11 and GaN 22 (of 3-μm thickness) thereon were deposited because heating was conducted from below substrate 10. However, heating was conducted from above substrate 10 during deposition of the subsequent single quantum well, so that the direction of warpage of substrate 10 was changed and reversed into a projecting shape toward heater 7 during deposition of InGaN 52. After the reversal, substrate 10 was curved into a projecting shape toward heater 7.

Based on FIG. 10 and the foregoing description, to achieve a sharp change in composition of a thin film at the interface, heating with heater 7 disposed above substrate 10 is preferable when the first lattice constant of a material that will constitute a thin film to be deposited is larger than the second lattice constant of a material constituting a main surface of the substrate (on which the thin film is to be deposited). When the first lattice constant is smaller than the second lattice constant, heating with heater 2 disposed below substrate 10 is preferable. Because InGaN 52 has a lattice constant larger than that of GaN 22, it can be said that heating with heater 7 disposed above substrate 10 as in sample 1-3, for example, is preferable particularly when InGaN 52 is deposited.

The three types of samples obtained as described above were subjected to evaluations of compositional sharpness of In composition near the interface between GaN 22 (10 nm) and InGaN 52 (3 nm, 15% In) deposited thereon, which constitute the quantum well, by means of high resolution RBS or sectional TEM. The interface sharpness was also evaluated by X-ray interferometry by means of X-ray reflectance measurement (XRR or GIXA). Further, PL evaluation, which is a method of evaluating semiconductor materials by examining light emission through semiconductor, was conducted by means of an He—Cd laser. The results are shown in Table 1 below. Sample number 1-1 in Table 1, for example, represents the above-described sample 1-1.

TABLE 1

| Sample Number | Compositional Sharpness | Interface Sharpness (XRR) | PL Intensity (assuming that 1-1 has 1) |
|---|---|---|---|
| 1-1 | Width of transition layer: 1.2 nm | Good | 1.0 |
| 1-2 | Width of transition layer: 1.2 nm | Good | 1.2 |
| 1-3 | Width of transition layer: 0.8 nm | Extremely Good | 8.6 |

From the data shown in Table 1 on the compositional sharpness as the sharpness of In composition near the interface, a determination can be made that a sharper interface is obtained as the transition layer decreases in width. Table 1 shows that sample 1-3 obtained by film deposition with InGaN 52 deposited by heating with heater 7 above substrate 10 has a transition layer of a smaller width and a better sharpness than in samples 1-1 and 1-2 obtained by film deposition always by heating with heater 2 below substrate 10, without controlling heating of the heaters. Sample 1-3 having an improved In sharpness was also evaluated as "Extremely Good" as a result of evaluation of interface sharpness measured by means of XRR, whereas samples 1-1 and 1-2 were evaluated as "Good." Table 1 further shows that, as to the relative results of PL intensities of samples 1-2 and 1-3 assuming that the evaluation result of PL intensity of sample 1-1 is 1, sample 1-3 is significantly better than samples 1-1 and 1-2. The evaluation result of "Good" as to the interface sharpness specifically represents a case in which the interface had a roughness of about 1 to 2 nm, and "Extremely Good" specifically represents a case in which the interface had a roughness less than 1 nm.

Based on the above results, when an InGaN thin film is deposited using film deposition apparatus 200 (MOVPE furnace) capable of controlling the direction of warpage of substrate 10, substrate 10 curved in the direction projecting toward heater 7 (into a projecting shape) could be improved in interface sharpness and PL intensity, although conventionally curved in the direction recessed toward heater 7 (into a recessed shape). Controlling the direction of warpage of substrate 10 can thereby sharply change the composition of the thin film at the interface. As a result, the crystal characteristic and the film quality near the interface could be improved.

In MOVPE, a thin film of InGaN 52 can be epitaxially grown on substrate 10 with a trimethylindium (TMIn) gas, a trimethylgallium (TMG) gas and an ammonia gas supplied through source gas nozzle 4 of film deposition apparatus 200, for example. However, GaN of the same kind having the same lattice constant is likely to be grown on a GaN thin film. Therefore, when growing InGaN, In is difficult to be captured particularly at the beginning, and it requires time until the composition is stabilized. As a result, an InGaN transition layer having an In composition (density) lower than a design value is produced. Therefore, curving substrate 10 to be warped in the direction projecting toward heater 7 will increase the lattice constant of the outermost surface on which a film is to be deposited because of apparent warpage in the projecting direction, so that a difference from the lattice constant of InGaN larger than that of GaN decreases. This allows In to be more likely to be captured and InGaN to be deposited sharply on GaN as easily as possible. As a result, the sharpness of In composition was improved. It is considered that, as a result of the improved sharpness of In composition, improved results could also be obtained for the interface sharpness measured by means of XRR and, further for the PL intensity.

In the case of a multi quantum well structure with two or more layers of quantum wells stacked, similar effects were obtained to those in the case of a single-layer quantum well as described above.

Depending on the conditions of growing GaN 22 (of 3-μm thickness), the substrate may be significantly warped into a recessed shape at the time point when GaN 22 is deposited. Even if heating with a heater is changed from the state of heating only with heater 2 below substrate 10 to the state of heating only with heater 7 above substrate 10, the substrate may not be brought into a projecting shape, although the recessed warp can be reduced. In that case, heating with heater 7 above substrate 10 for growing a quantum well can achieve more favorable characteristics than when heating only with heater 2 below substrate 10 also for growing a quantum well after GaN 22 (of 3-μm thickness).

Second Example

Figure 12:
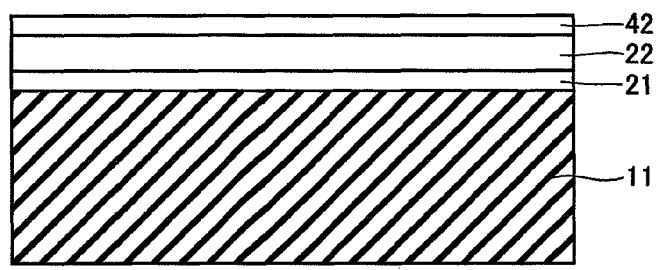
FIG. 12 is a schematic sectional view of a heteroepitaxial structure in a second example of the present invention.

In a second example, samples of a stacked structure (heteroepitaxial structure) of heteroepitaxial films, which will be described below, were also prepared by heteroepitaxial growth with metalorganic vapor phase epitaxy (MOVPE) adopted. As shown in FIG. 12, low-temperature GaN 21 of 25-nm thickness was deposited on one main surface of 1-inch-diameter sapphire substrate 11. GaN 22 of 3-μm thickness was deposited thereon. Further, a 25-nm-thick thin film of AlGaN 42 having an aluminum (Al) composition of 25% was deposited thereon. A stacked structure of heteroepitaxial films having the above-described stacked structure, called AlGaN/GaN HEMT (high electron mobility transistor), is obtained. That is, the single quantum well obtained herein includes AlGaN (25 nm, 25% Al)/GaN (3 μm)/low-temperature GaN (25 nm)/sapphire substrate, in this order from the outermost layer to the substrate. Herein, three types of samples of the above-described stacked structure were prepared.

A sample 2-1 was obtained by film deposition using film deposition apparatus 100. More specifically, all the epitaxial films were deposited by heating from below substrate 10 to form the above-described stacked structure. For a sample 2-2, all the epitaxial films were deposited by heating from below substrate 10 (with heater 2) using film deposition apparatus 200 to form the above-described stacked structure. Film deposition apparatus 200 was also used for a sample 2-3 to deposit low-temperature GaN 21 (of 25-nm thickness) on one main surface of sapphire substrate 11 and GaN 22 (of 3-μm thickness) thereon by heating from below substrate 10 with heater 2. A stacked structure thereon including the layer of AlGaN 42 (25 nm, 25% Al) was deposited by heating from above substrate 10 with heater 7.

Conditions under which the films were deposited to obtain the layer of AlGaN 42 in samples 2-1, 2-2 and 2-3 were such that substrate 10 had a temperature of 1050° C., and the pressures by source gases were normal pressures. Similarly to film deposition to obtain samples 1-1, 1-2 and 1-3, the curvature of substrate 10 was measured in real time with module 5. The direction and amount of warpage were also measured in real time.

Because AlGaN 42 has a lattice constant smaller than that of GaN 22, it can be theoretically said that heating is preferably conducted with heater 2 disposed below substrate 10 as in samples 2-1 and 2-2, for example, particularly when AlGaN 42 is deposited.

The three types of samples obtained as described above were subjected to evaluations of compositional sharpness of Al composition near the interface between GaN 22 (3 μm) and AlGaN 42 (25 nm, 25 mass % Al) by means of high resolution RBS or sectional TEM. The interface sharpness was also evaluated by X-ray interferometry by means of X-ray reflectance measurement (XRR or GIXA). Further, the mobility of carriers such as electrons in semiconductor and the sheet resistance of the stacked structure were evaluated by means of Hall measurement. The results are shown in Table 2 below.

TABLE 2

| Sample Number | Compositional Sharpness | Interface Sharpness (XRR) | Mobility ($cm^2/Vs$) | Sheet Resistance ($\Omega$/sq) |
| --- | --- | --- | --- | --- |
| 2-1 | Width of transition layer: 1.0 nm | Extremely Good | 1410 | 417 |
| 2-2 | Width of transition layer: 1.0 nm | Extremely Good | 1430 | 413 |
| 2-3 | Width of transition layer: 2.0 nm | Good | 1270 | 437 |

From the data shown in Table 2 on the compositional sharpness as the sharpness of Al composition near the interface, a determination can be made that a sharper interface is obtained as the transition layer decreases in width. Table 2 shows that samples 2-1 and 2-2 obtained by film deposition with AlGaN 42 deposited by heating only with heater 2 below substrate 10 has a transition layer of a smaller width and better sharpness than in sample 2-3 obtained with AlGaN 42 deposited by heating with heater 7 above substrate 10. Samples 2-1 and 2-2 having an improved Al sharpness were also evaluated as "Extremely Good" as a result of evaluation of interface sharpness measured by means of XRR, whereas sample 2-3 was evaluated as "Good." Table 2 also shows that samples 2-1 and 2-2 also have better results of the mobility of carriers, such as electrons, than sample 2-3. Samples 2-1 and 2-2 also have lower sheet resistances than sample 2-3.

Based on the above results, when an AlGaN thin film is deposited using film deposition apparatus 200 (MOVPE furnace) capable of controlling the direction of warpage of substrate 10, substrate 10 heated with heater 2 to be curved in the direction recessed toward heater 7 (into a recessed shape) could be improved in interface sharpness, carrier mobility and so forth, although conventionally curved in the direction projecting toward heater 7 (into a projecting shape) when heated with heater 7. Controlling the direction of warpage of substrate 10 could thereby sharply change the composition of the thin film at the interface. As a result, the crystal characteristic and the film quality near the interface could be improved.

In MOVPE, a thin film of AlGaN 42 can be epitaxially grown on substrate 10 with a trimethylaluminum (TMA) gas, a trimethylgallium (TMG) gas and an ammonia gas supplied through source gas nozzle 4 of film deposition apparatus 200, for example. However, GaN of the same kind having the same lattice constant is likely to be grown on a GaN thin film. Therefore, when growing AlGaN, Al is difficult to be captured particularly at the beginning, and it requires time until the composition is stabilized. As a result, an AlGaN transition layer having an Al composition (density) lower than a design value is produced. Therefore, curving substrate 10 to be warped in the direction recessed toward heater 7 will decrease the lattice constant of the outermost surface on which a film is to be deposited because of apparent warpage in the recessed direction, so that a difference from the lattice constant of AlGaN smaller than that of GaN decreases. This allows Al to be more likely to be captured and AlGaN to be deposited sharply on GaN as easily as possible. As a result, the sharpness of Al composition was improved. It is considered that, as a result of the improved sharpness of Al composition, improved results could also be obtained for the interface sharpness measured by means of XRR and, further for the carrier mobility.

Third Example

Figure 13:
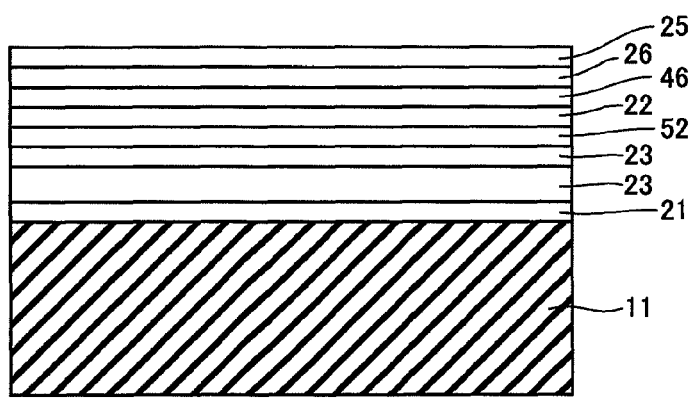
FIG. 13 is a schematic sectional view of a heteroepitaxial structure in a third example of the present invention.

To examine the effects obtained when the stacked structures produced in First and Second Examples were applied to light emitting LED, samples of a stacked structure (heteroepitaxial structure) of heteroepitaxial films, which will be described below, were prepared by heteroepitaxial growth with metalorganic vapor phase epitaxy (MOVPE) adopted. As shown in FIG. 13, low-temperature GaN 21 of 25-nm thickness was deposited on one main surface of 1-inch-diameter sapphire substrate 11. $n^+$GaN 23 of 3-μm thickness was deposited thereon. Further, thin films of $n^+$GaN 23 of 10-nm thickness, InGaN 52 of 3-nm thickness having an indium (In) composition of 15%, GaN 22 of 10-nm thickness, $p^-$AlGaN 46 of 20-nm thickness, p–GaN 26 of 20-nm thickness, and $p^+$GaN 25 of 20-nm thickness were sequentially deposited thereon. A standard LED structure using a single quantum well having the above-described stacked structure is obtained. That is, the single quantum well obtained herein includes $p^+$GaN (20 nm)/$p^-$GaN (20 nm)/$p^-$AlGaN (20 nm)/GaN (10 nm)/InGaN (15% In, 3 nm)/$n^+$GaN (10 nm)/$n^+$GaN (3 μm)/low-temperature GaN (25 nm)/sapphire substrate, in this order from the outermost layer to the substrate. Herein, four types of samples of the above-described single quantum well were prepared.

A sample 3-1 was obtained by film deposition using film deposition apparatus 100. More specifically, all the epitaxial films were deposited by heating from below substrate 10 to form the above-described stacked structure. For a sample 3-2, all the epitaxial films were deposited by heating from below substrate 10 (with heater 2) using film deposition apparatus 200 to form the above-described stacked structure. Film deposition apparatus 200 was also used for a sample 3-3 to deposit low-temperature GaN 21 (of 25-nm thickness) on one main surface of sapphire substrate 11 and $n^+$GaN 22 (of 3-μm thickness) thereon by heating from below substrate 10 with heater 2. The thin film of $n^+$GaN 23 (of 10-nm thickness) and subsequent films were deposited by heating from above substrate 10 with heater 7. That is, for sample 3-3, InGaN 52 and $p^-$AlGaN 46 were both deposited by heating with heater 7 from above substrate 10. Film deposition apparatus 200 was also used for a sample 3-4 to deposit low-temperature GaN 21 (of 25-nm thickness) on one main surface of sapphire substrate 11 and $n^+$GaN 23 (of 3-μm thickness) thereon by heating from below substrate 10 with heater 2. $n^+$GaN 23 (of 10-nm thickness), InGaN 52 (3 nm) and GaN 22 (10 nm) were deposited thereon by heating from above substrate 10 with heater 7. Then, $p^-$AlGaN 46 (20 nm), $p^-$GaN 26 (20 nm) and $p^+$GaN 25 (20 nm) were deposited thereon by heating from below substrate 10 with heater 2 again. That is, for sample 3-4, InGaN 52 was deposited by heating from above, and $p^-$AlGaN 46 was deposited by heating from below.

Conditions under which the films were deposited to obtain the respective samples 3-1, 3-2, 3-3, and 3-4 conformed to those when depositing the films to obtain the samples prepared in the aforementioned First and Second Examples, except that substrate 10 had a temperature of 1000° C. when $p^-$AlGaN 46 (20 nm), $p^-$GaN 26 (20 nm) and $p^+$GaN 25 (20 nm) were deposited. Similarly to film deposition to obtain the samples prepared in the aforementioned First and Second Examples, the curvature of substrate 10 was measured in real time with module 5. The direction and amount of warpage were also measured in real time.

Because InGaN has a lattice constant larger than that of GaN as described earlier, it can be theoretically said that heating is preferably conducted with heater 7 disposed above substrate 10, particularly when InGaN 52 is deposited. In addition, because AlGaN has a lattice constant smaller than that of GaN, it can be theoretically said that heating is preferably conducted with heater 2 disposed below substrate 10, particularly when $p^-$AlGaN 46 is deposited.

Samples 3-1 to 3-4 obtained through the above-described procedures were subjected to PL evaluation by means of an He—Cd laser. Further, each of these samples were provided with an n type electrode and a p type electrode to obtain an LED diode, which was then subjected to EL evaluation for evaluating a light output of the LED. The results are shown in Table 3 below.

TABLE 3

| Sample Number | PL Intensity (assuming that 3-1 has 1) | EL Evaluation (assuming that 3-1 has 1) |
| --- | --- | --- |
| 3-1 | 1.0 | 1.0 |
| 3-2 | 1.2 | 1.2 |
| 3-3 | 13.7 | 3.6 |
| 3-4 | 17.4 | 4.3 |

Table 3 shows relative results of samples 3-2, 3-3 and 3-4 assuming that data indicative of the PL intensity obtained by PL evaluation and the result of EL evaluation of sample 3-1 are 1. From Table 3, it can be said that samples 3-3 and 3-4 obtained by heating from above when InGaN 52 (3 nm) having a lattice constant larger than that of GaN is deposited on $n^+$GaN 23 (10 nm) have been improved both in PL intensity (PL characteristic) and EL evaluation (EL characteristic), as compared to samples 3-1 and 3-2 obtained by depositing all the thin films by heating from below. Sample 3-4 obtained by heating from below again when $p^-$AlGaN 46 (20 nm) having a lattice constant smaller than that of GaN is deposited on GaN 22 (10 nm) has even better results both in PL intensity (PL characteristic) and EL evaluation (EL characteristic) than sample 3-3 obtained by depositing $n^+$GaN 23 (10 nm) and subsequent thin films by heating from above. It is to be noted that similar effects to those in the case of a single-layer quantum well described above were also obtained in the case of an LED diode of a multi quantum well structure with two or more layers of quantum wells stacked.

Based on the above results, when thin films made of materials having a lattice constant larger than that of a main surface of a substrate are deposited, such as when InGaN is deposited on GaN, the substrate is preferably heated from above and curved to project toward heater 7. In contrast, when thin films made of materials having a lattice constant smaller than that of a main surface of a substrate are deposited, such as when AlGaN is deposited on GaN, the substrate is preferably heated from below and curved to be recessed toward heater 7. In this manner, by controlling the direction of warpage of the substrate during heteroepitaxial growth utilizing the fact that the direction of warpage of the substrate changes depending on the direction of heating, characteristics of the multilayered structure of the deposited films, such as PL characteristic and EL characteristic, can be improved. This is considered as having been caused by improvements in compositional sharpness and interface sharpness at the interface during film deposition. In addition, as described above, by controlling the direction of warpage of the substrate to improve the compositional sharpness and interface sharpness at the interface of thin films of the multilayered structure, characteristics such as the carrier mobility and the sheet resistance can also be improved, which can lead to improved film quality as a whole.

Fourth Example

Figure 14:
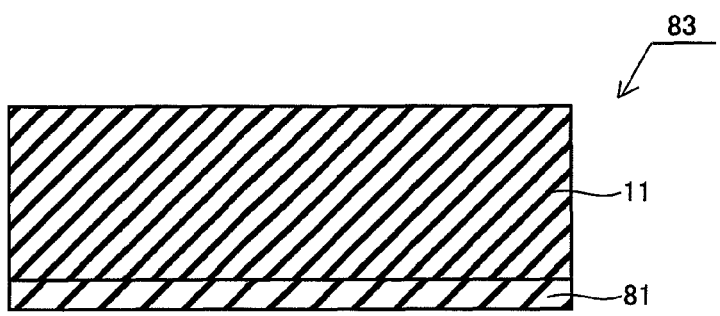
FIG. 14 is a schematic sectional view of a sapphire substrate with a silicon oxide film deposited on one main surface opposite to one main surface on which a multilayered structure is to be deposited.
Figure 15:
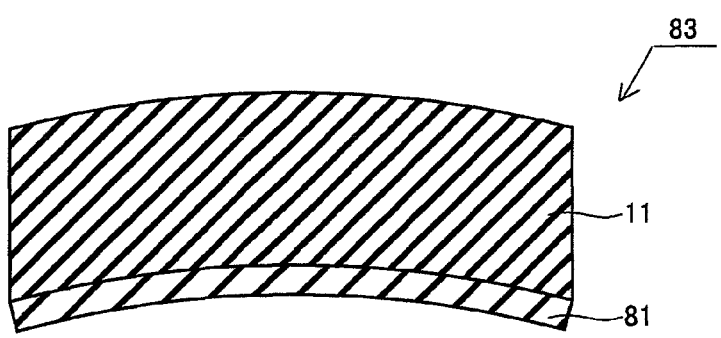
FIG. 15 is a schematic sectional view showing a state where a substrate 83 is heated, expanded, and curved.

In the above examples, the multilayered structures were obtained using sapphire substrates. However, film deposition may be performed on the other main surface of a substrate, such as a sapphire substrate or a silicon substrate, opposite to the main surface on which a multilayered structure is to be deposited, so that the substrate is warped to a greater degree. A substrate 83 shown in FIG. 14 has a silicon oxide film 81 ($SiO_2$) deposited on the other main surface (at the lower side in the drawing) of sapphire substrate 11 opposite to the main surface (at the upper side in the drawing) on which a multilayered structure is to be deposited. $SiO_2$ has a thermal expansion coefficient smaller than that of sapphire. Therefore, when substrate 83 is heated, for example, silicon oxide film 81 expands by a smaller degree than sapphire substrate 11 does. Substrate 83 is accordingly curved into a recessed shape toward silicon oxide film 81 relative to the direction along the main surfaces of sapphire substrate 11. Conversely, substrate 83 is curved into a projecting shape toward sapphire substrate 11. From the foregoing reasons, when heated, substrate 83 is curved as shown in FIG. 15. It is to be noted that silicon oxide film 81 may be replaced by a thin film made of silicon, for example, in order to obtain similar effects.

For example, substrate 83 is laid on susceptor 1 of film deposition apparatus 200 such that sapphire substrate 11 faces the upper side and silicon oxide film 81 faces the lower side (such that one main surface of silicon oxide film 81 is in contact with susceptor 1). Heater 7 as the first heating member located above susceptor 1 is then heated to heat substrate 83 from the upper side of the drawing. In this case, sapphire substrate 11 will be heated more than silicon oxide film 81. Sapphire substrate 11 has a thermal expansion coefficient larger than that of silicon oxide film 81. From these reasons, when the main surface of substrate 83 is heated from the side of sapphire substrate 11, sapphire substrate 11 is significantly curved into a projecting shape toward heater 7 (upwardly). This amount of warpage is even greater than the amount of warpage of sapphire substrate 11, without silicon oxide film 81 deposited thereon, which is curved into a projecting shape toward heater 7 (upwardly) when similarly heated. In this manner, by preparing substrate 83 with a plurality of layers made of materials having different thermal expansion coefficients from each other stacked, the amount of warpage of the substrate can be increased further.

In contrast, as described above, substrate 83 is laid on susceptor 1 of film deposition apparatus 200 such that sapphire substrate 11 faces the upper side and silicon oxide film 81 faces the lower side (such that one main surface of silicon oxide film 81 is in contact with susceptor 1), and heater 2 as the second heating member located below susceptor 1 is then heated to heat substrate 83 from the lower side of the drawing. In this case, silicon oxide film 81 located at the lower side will be heated more than sapphire substrate 11 located at the upper side. However, since silicon oxide film 81 has a thermal expansion coefficient smaller than that of sapphire substrate 11, silicon oxide film 81 expands by a smaller degree than sapphire substrate 11 does when heated. Therefore, when heated from the side of silicon oxide film 81 relative to the main surfaces as described above, substrate 83 is warped by a smaller amount than when heated from the side of sapphire substrate 11.

Substrate 83 described above was used to prepare similar samples to those in aforementioned First Example, and similar evaluations were conducted. A structure with silicon oxide film 81 deposited on a main surface of sapphire substrate 11 in the heteroepitaxial structure shown in FIG. 11 opposite to the main surface on which the stacked structure was deposited (at the lower side of sapphire substrate 11 in the drawing) was prepared. The substrate is laid such that one main surface of silicon oxide film 81 is in contact with susceptor 1 of film deposition apparatus 100 or 200. Other conditions all conform to those in First Example. A sample 4-1 conforming to sample 1-1, a sample 4-2 conforming to sample 1-2, and a sample 4-3 conforming to sample 1-3 were prepared. These samples 4-1, 4-2 and 4-3 were then subjected to evaluations similar to those in First Example. The results are shown in Table 4 below.

TABLE 4

| Sample Number | Compositional Sharpness | Interface Sharpness (XRR) | PL Intensity (assuming that 1-1 has 1) |
|---|---|---|---|
| 4-1 | Transition region: about 0.9 nm | Extremely Good | 4.2 |
| 4-2 | Transition region: about 0.9 nm | Extremely Good | 5.1 |
| 4-3 | Transition region: about 0.6 nm | Extremely Good | 17.6 |

Comparison between the results shown in Table 4 and those in Table 1 shows that, for example, the transition layer in sample 4-1 conforming to sample 1-1 has a width smaller than that of sample 1-1, so that sharpness is further improved. Similar results were obtained for sample 4-2 conforming to sample 1-2 and sample 4-3 conforming to sample 1-3. The result of evaluation of interface sharpness shows that samples 1-1 and 1-2 are "Good", while samples 4-1 and 4-2 respectively conforming to these samples are "Extremely Good." Table 4 also shows that, as to the relative results of PL intensity assuming that the evaluation result of PL intensity of sample 1-1 is 1, sample 4-1 has also been significantly improved. Similarly, samples 4-2 and 4-3 also have significantly better results of PL intensities than samples 1-2 and 1-3, respectively. That is, it is considered that curving the substrate in the projecting direction so as to obtain a greater curvature when growing a quantum well has improved the sharpness of In composition in the film of InGaN 52, and has improved the PL characteristic.

Fifth Example

Figure 16:
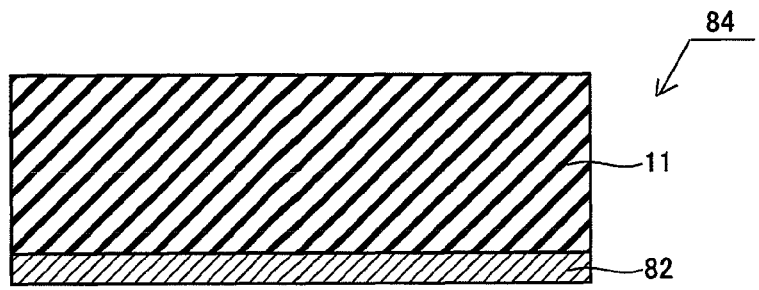
FIG. 16 is a schematic sectional view of a sapphire substrate with a nickel thin film deposited on one main surface opposite to one main surface on which a multilayered structure is to be deposited.
Figure 17:
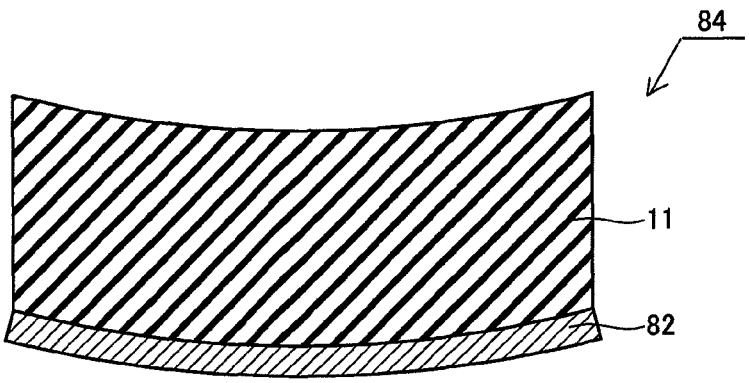
FIG. 17 is a schematic sectional view showing a state where a substrate 84 is expanded by heating and curved.

A substrate 84 shown in FIG. 16 has a nickel thin film 82 (Ni) deposited on the other main surface (at the lower side of the drawing) of sapphire substrate 11 opposite to the main surface (at the upper side of the drawing) on which a multilayered structure is to be deposited. Ni has a thermal expansion coefficient larger than that of sapphire. Therefore, when substrate 84 is heated, for example, nickel thin film 82 expands by a greater degree than sapphire substrate 11 does. Substrate 84 is accordingly curved to into a projecting shape toward nickel thin film 82 relative to the direction along the main surfaces of sapphire substrate 11. Conversely, substrate 84 is curved into a recessed shape toward sapphire substrate 11. From the foregoing reasons, when heated, substrate 84 is curved as shown in FIG. 17. It is to be noted that nickel thin film 82 may be replaced by a thin film made of gold or platinum in order to obtain similar effects.

For example, substrate 84 is laid on susceptor 1 of film deposition apparatus 200 such that sapphire substrate 11 faces the upper side and nickel thin film 82 faces the lower side (such that one main surface of nickel thin film 82 is in contact with susceptor 1). Heater 2 as the second heating member located below susceptor 1 is then heated to heat substrate 84 from the lower side of the drawing. In this case, nickel thin film 82 will be heated more than sapphire substrate 11. Nickel thin film 82 has a thermal expansion coefficient larger than that of sapphire substrate 11. From these reasons, when the main surface of substrate 84 is heated from the side of nickel thin film 82 relative to the main surfaces, sapphire substrate 11 is significantly curved into a recessed shape toward heater 7 (upwardly). This amount of warpage is even greater than the amount of warpage of sapphire substrate 11, without nickel thin film 82 deposited thereon, which is curved into a recessed shape toward heater 7 (upwardly) when similarly heated. In this manner, by preparing substrate 84 with a plurality of layers made of materials having different thermal expansion coefficients from each other stacked, the amount of warpage of the substrate can be increased further.

In contrast, as described above, substrate 84 is laid on susceptor 1 of film deposition apparatus 200 such that sapphire substrate 11 faces the upper side and nickel thin film 82 faces the lower side (such that one main surface of nickel thin film 82 is in contact with susceptor 1), and heater 7 as the first heating member located above susceptor 1 is then heated to heat substrate 84 from the upper side of the drawing. In this case, sapphire substrate 11 located at the upper side will be heated more than nickel thin film 82 located at the lower side. However, since sapphire substrate 11 has a thermal expansion coefficient smaller than that of nickel thin film 82, sapphire substrate 11 expands by a smaller rate than nickel thin film 82 does when heated. When heated from the side of sapphire substrate 11 relative to the main surfaces, substrate 84 is warped by a smaller amount than when heated from the side of nickel thin film 82.

Substrate 84 described above was used to prepare similar samples to those in aforementioned Second Example, and similar evaluations were conducted. A structure with nickel thin film 82 deposited on a main surface of sapphire substrate 11 in the heteroepitaxial structure shown in FIG. 12 opposite to the main surface on which the stacked structure was deposited (at the lower side of sapphire substrate 11 in the drawing) was prepared. The substrate is laid such that one main surface of nickel thin film 82 is in contact with susceptor 1 of film deposition apparatus 100 or 200. Other conditions all conform to those in Second Example. A sample 5-1 conforming to sample 2-1, a sample 5-2 conforming to sample 2-2, and a sample 5-3 conforming to sample 2-3 were prepared. These samples 5-1, 5-2 and 5-3 were then subjected to evaluations similar to those in Second Example. The results are shown in Table 5 below.

TABLE 5

| Sample Number | Compositional Sharpness | Interface Sharpness (XRR) | Mobility (cm$^2$/Vs) | Sheet Resistance (Ω/sq) |
|---|---|---|---|---|
| 5-1 | Transition region: about 0.6 nm | Extremely Good | 1530 | 394 |
| 5-2 | Transition region: about 0.6 nm | Extremely Good | 1550 | 390 |
| 5-3 | Transition region: about 1.2 nm | Good | 1390 | 420 |

Comparison between the results shown in Table 5 and those in Table 2 shows that, for example, the transition layer in sample 5-1 conforming to sample 2-1 has a width smaller than that of sample 2-1, so that sharpness is further improved. Similar results were obtained for sample 5-2 conforming to sample 2-2 and sample 5-3 conforming to sample 2-3. Sample 5-1 conforming to sample 2-1 also has a better mobility than sample 2-1. Similar results were obtained for samples 5-2 and 5-3. Sample 5-1 conforming to sample 2-1 further has a lower (better) sheet resistance than sample 2-1. Similar results were obtained for samples 5-2 and 5-3. Based on these results, it is considered that, when AlGaN 42 is deposited in the heteroepitaxial structure of AlGaN/GaN HEMT, curving the substrate in the recessed direction so as to obtain a greater curvature improved the sharpness of Al composition in the film of AlGaN 42, improved the mobility, and reduced the sheet resistance.

When films are deposited on substrates 83 and 84 shown in Fourth and Fifth Examples, respectively, using film deposition apparatus 200, the difference in thermal expansion coefficient between one main surface and the other main surface of the substrate can cause the substrate to be curved, even if outputs (heating temperatures) of heaters 7 and 2 are made substantially identical, for example, to reduce the temperature difference between a region facing the one main surface of the substrate and a region facing the other main surface of the substrate opposite to the one main surface.

It should be construed that the embodiments and the examples disclosed herein are by way of illustration in all respects and not intended to be limiting. It is intended that the scope of the present invention is defined by claims, not by the description above, and includes all modifications equivalent in meaning and scope to the claims.

INDUSTRIAL APPLICABILITY

The film deposition method according to the present invention is particularly favorable as a technique of improving the characteristics of a heteroepitaxial structure by sharply changing the composition at the interface of a heteroepitaxial film.

DESCRIPTION OF THE REFERENCE SIGNS 1 susceptor; 2, 7, 8 heater; 3 flow channel; 4 source gas nozzle; 5 module; 6 heating jig; 10, 83, 84 substrate; 11 sapphire substrate; 21 low-temperature GaN; 22 GaN; 23 n$^+$GaN; 25 p$^+$GaN; 26 p$^-$GaN; 30 controller; 42 AlGaN; 46 p$^-$AlGaN; 52 InGaN; 81 silicon oxide film; 82 nickel thin film; 91, 94 smaller cell; 92, 93 larger cell; 100, 200, 201 film deposition apparatus.

The invention claimed is:
1. A film deposition method of depositing a thin film on one main surface of a substrate, comprising the steps of:
preparing the substrate;
curving said substrate relative to a direction along said one main surface; and after curving said substrate, depositing the thin film on said one main surface of said substrate with said substrate curved, wherein in said step of curving said substrate, said substrate is curved by independently controlling heating temperatures of a first heating member disposed to face said one main surface of said substrate and a second heating member disposed to face the other main surface of said substrate opposite to said one main surface, wherein said substrate is curved relative to the direction along said one main surface in accordance with a first lattice constant as a lattice constant of a material that will constitute said thin film to be deposited and a second lattice constant as a lattice constant of a material constituting said one main surface of said substrate on which said thin film is to be deposited, and wherein when said first lattice constant is larger than said second lattice constant, said substrate is curved in a direction projecting toward said one main surface with respect to a shape before execution of the step of curving said substrate, and when said first lattice constant is smaller than said second lattice constant, said substrate is curved in a direction recessed toward said one main surface with respect to the shape before execution of the step of curving said substrate.

2. The film deposition method according to claim 1, further comprising the steps of:

after said step of depositing the thin film, curving said substrate again in an opposite direction to the direction that said substrate has been curved in said step of curving said substrate relative to the direction along said one main surface, and depositing the thin film on said one main surface of said substrate with said substrate curved in said opposite direction.

3. The film deposition method according to claim 1, wherein in said step of preparing said substrate, a substrate with a plurality of layers made of materials having different thermal expansion coefficients from each other stacked is prepared.

4. The film deposition method according to claim 1, wherein in said step of depositing said thin film, a source gas of a component that will constitute the thin film to be deposited is supplied onto said one main surface of said substrate having been heated.

5. The film deposition method according to claim 4, wherein said source gas includes metalorganic compound vapors.

6. The film deposition method according to claim 4, wherein said source gas includes group III element compound vapors.

7. A film deposition method of depositing a thin film on one main surface of a substrate, comprising the steps of:

preparing the substrate;

curving said substrate relative to a direction along said one main surface; and after curving said substrate, depositing the thin film on said one main surface of said substrate with said substrate curved, wherein in said step of curving said substrate, said substrate is curved by independently controlling heating temperatures of a first heating member disposed to face said one main surface of said substrate and a second heating member disposed to face the other main surface of said substrate opposite to said one main surface, wherein said substrate is curved relative to the direction along said one main surface in accordance with a first lattice constant as a lattice constant of a material that will constitute said thin film to be deposited and a second lattice constant as a lattice constant of a material constituting said one main surface of said substrate on which said thin film is to be deposited, and wherein in said step of curving said substrate, when said first lattice constant is larger than said second lattice constant, said substrate is curved into a projecting shape toward said one main surface, and when said first lattice constant is smaller than said second lattice constant, said substrate is curved into a recessed shape toward said one main surface.

8. The film deposition method according to claim 7, further comprising the steps of:

after said step of depositing the thin film, curving said substrate again in an opposite direction to the direction that said substrate has been curved in said step of curving said substrate relative to the direction along said one main surface, and depositing the thin film on said one main surface of said substrate with said substrate curved in said opposite direction.

9. The film deposition method according to claim 7, wherein in said step of preparing said substrate, a substrate with a plurality of layers made of materials having different thermal expansion coefficients from each other stacked is prepared.

10. The film deposition method according to claim 7, wherein in said step of depositing said thin film, a source gas of a component that will constitute the thin film to be deposited is supplied onto said one main surface of said substrate having been heated.

11. The film deposition method according to claim 10, wherein said source gas includes metalorganic compound vapors.

12. The film deposition method according to claim 10, wherein said source gas includes group III element compound vapors.

* * * * *